(12) United States Patent
Laukkanen et al.

(10) Patent No.: US 6,460,156 B1
(45) Date of Patent: Oct. 1, 2002

(54) DATA TRANSMISSION METHOD AND SYSTEM

(75) Inventors: Mika Laukkanen, Muhos; Tapani Jari Westman, Oulu, both of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/462,937

(22) PCT Filed: Jul. 15, 1998

(86) PCT No.: PCT/FI99/00596

§ 371 (c)(1),
(2), (4) Date: Apr. 3, 2000

(87) PCT Pub. No.: WO99/07075

PCT Pub. Date: Feb. 11, 1999

(30) Foreign Application Priority Data

Jul. 18, 1997 (FI) ................................................. 973066

(51) Int. Cl.[7] ...................... H03M 13/27; H03M 13/29; H03M 13/35
(52) U.S. Cl. ........................ 714/755; 714/762; 714/788
(58) Field of Search ................................ 714/755, 762, 714/788

(56) References Cited

U.S. PATENT DOCUMENTS 4,907,233 A   3/1990   Deutsch et al. ............ 371/37.4
5,023,889 A   6/1991   Divsalar et al. ............... 375/27
5,563,887 A   10/1996  Harasaki ..................... 370/94.1
5,659,578 A * 8/1997   Alamouti et al. ........... 375/261

FOREIGN PATENT DOCUMENTS

EP         0551973 A3    7/1993
WO         WO 96/16496   5/1996

OTHER PUBLICATIONS

"Coded 64–CAP ADSL In An Impulse–Noise Environment––Modeling Of Impulse Noise And First Simulation Results", Henkel et al., IEEE Journal on Selected Areas In Communications, vol. 13, No. 9, 1995.

* cited by examiner

Primary Examiner—Stephen M. Baker
(74) Attorney, Agent, or Firm—Perman & Green, LLP

(57) ABSTRACT

In a data transmission method and system, user signals are transmitted wirelessly, and a maximum delay for the system has been defined. The system includes circuitry at the transmitting end for sequentially performing an outer and inner coding on the signals to be transmitted, and circuitry for performing a first interleaving after the outer coding. The interleaving length of the first interleaving is chosen within the scope of the maximum delay defined for the system. To ensure improved performance, the system includes circuitry for performing a second interleaving after the inner coding, and the interleaving length of the second interleaving is substantially equal to the interleaving length of the first interleaving.

3 Claims, 2 Drawing Sheets

DATA TRANSMISSION METHOD AND SYSTEM

FIELD OF THE INVENTION

The invention relates to a data transmission method in a wireless telecommunications system wherein the user signals are transmitted in a given channel and a maximum delay has been defined for said system, and wherein an outer coding and an inner coding are sequentially performed to the signals to be transmitted, and wherein a first interleaving is performed to a signal after the outer coding, the interleaving length of said first interleaving being chosen within the scope of the maximum delay defined for the system.

BACKGROUND OF THE INVENTION

As well known, the channel used for transmitting signals in telecommunications connections causes interference in telecommunications. This occurs independently of the physical form of the channel, whether the channel is a radio connection, an optical fibre or a copper cable, for instance.

In order to reduce the channel-caused interference and its effects and to ensure a more reliable transmission connection, a digital signal is coded. A typical coding method used in cellular radio applications is convolution coding, which is well suited to a fading channel. In a typical radio channel between a base station and a mobile station, errors occur in bursts, in other words they are unevenly distributed in time domain. This is the reason for using in cellular radio systems interleaving, which aims at changing the bursty errors caused by a channel to separate errors independent of each other. In a known interleaving system used in the CDMA systems, for example, the coded binary symbols are grouped into blocks in which the order of the bits is changed before transmission. This method can be called bit interleaving.

Wireless data transmission systems have conventionally been used only to transmit speech. The growth in the number of different services to be transmitted means, particularly in wireless systems, that the system must be able to transmit different capacity signals, such as speech, for instance, at a data rate of 8 kbit/s and data at a rate of 64 kbit/s, over a radio path. The data transmission system should thus be able to operate effectively in an environment where transmissions of several different data rates, quality standard requirements and service types are transmitted. Services of different type tolerate delays of different length, and maximum permissible delays corresponding to a particular service are set for the system, and the interleaving, for instance, also has to be performed within the scope of the maximum delays.

To enable transmission of high data rate signals particularly, coding methods have been developed in which two sequential codings are performed, a so called outer coding first, and a so called inner coding next. As a typical outer coding can be Reed-Solomon coding, for instance, whereupon a signal is usually formed to be frame-structured, and as a typical inner coding can be some convolution coding. Owing to the above reasons, interleaving has previously been employed in connection with this method. Interleaving has been performed in such a manner that the interleaving length of the interleaving performed after the outer coding has been chosen on the basis of the maximum system delay. The interleaving length of the interleaving subsequent to the inner coding has been determined by the length of the frame structure. This has aimed at minimizing the system delay.

The problem in the above arrangement is that the benefit gained from interleaving cannot be utilized in full, since the interleaving length of the interleaving has been determined by the length of the frame structure, which typically is substantially shorter than the maximum system delay.

BRIEF DESCRIPTION OF THE INVENTION

An object of the invention is thus to provide a method and a system solving the above problem. This is achieved with a method described in the introduction, the method being characterized in that a second interleaving is performed to the signal after the inner coding, the interleaving length of said second interleaving being substantially equal to the interleaving length of the first interleaving.

The invention further relates to a data transmission system wherein user signals are transmitted wirelessly in a given channel and a maximum delay has been defined for said system, said system comprising means at the transmitting end for performing sequentially an outer coding and an inner coding to the signals to be transmitted, means for performing a first interleaving to a signal after the outer coding, the interleaving length of said first interleaving being chosen within the scope of the maximum delay determined for the system. The system of the invention is characterized in that the system comprises means for performing a second interleaving to the signal after the inner coding, the interleaving length of said second interleaving being substantially equal to the interleaving length of the first interleaving.

Several advantages are achieved by the method and system of the invention. The invention is based on the fact that the interleaving subsequent to the inner coding does not have to be dependent on the length of the system frame structure, but the interleaving can be equal in length to the interleaving subsequent to the outer coding. In the solution of the invention, the system performance increases on account of the improved time diversity, which is important particularly when high capacity connections are involved. If a maximum system delay is 220 ms, for example, and the length of the system frame is 10 ms, the interleaving subsequent to the outer coding has previously been performed at a 100 ms interleaving length and the interleaving subsequent to the inner coding has been performed at a 10 ms interleaving length. The total delay caused by interleaving is thus 100 ms+10 ms, i.e., 110 ms, which leaves 20 ms for the other delays. In the solution of the invention, each interleaving is performed at a 100 ms interleaving length, whereby the time diversity of the interleaving can be utilized considerably more than before. Contrary to the prior art, in the solution of the invention the total system delay does not increase even though the interleaving length is increased.

An essential advantage of the invention is also that the total system delay can be decreased by the solution of the invention without impairing the performance.

BRIEF DESCRIPTION OF THE DRAWINGS

The invention is now described in closer detail in connection with the preferred embodiments with reference to the accompanying drawings, in which.

DETAILED DESCRIPTION OF THE INVENTION

Figure 1:
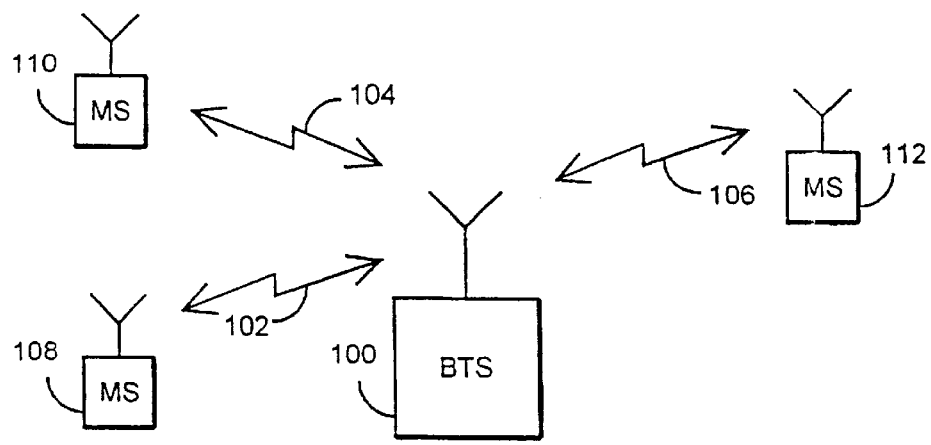
FIG. 1 shows an example of the data transmission system of the invention.

FIG. 1 illustrates a wireless data transmission system, in other words the part of a cellular radio system in which the method of the invention can be applied. The system comprises a base station 100, which is in bi-directional connection 102 to 106 to subscriber terminals 108 to 112. In the cellular radio system used as an example, the CDMA system is employed, and when being applied, the invention will be described below within the CDMA system without being restricted to it, however, which is understood by those skilled in the art. The essential features of the invention are independent of the multiple access system used.

In the system in FIG. 1, each connection has typically a separate spreading code whose bit rate, in other words a so-called chip rate, is substantially higher than the data rate, and by which the data to be transmitted has been multiplied and thus spread to a wide bandwidth. Receivers are able to distinguish the desired signal from other signals transmitted in the same frequency band on the basis of the spreading code. The solution of the invention to implement interleaving can be utilized both in a terminal equipment and in a base station.

Figure 2:
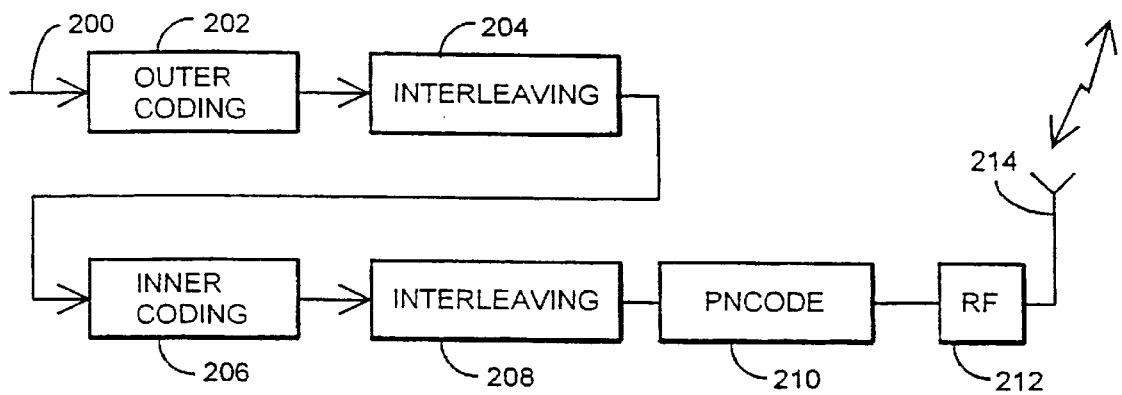
FIG. 2 illustrates a possible structure of the transmitter of the invention by means of a block diagram.

The operation of the solution of the invention will be illustrated in the following by means of the block diagram of FIG. 2. The block diagram shows a simplified structure of the transmitter of the system of the invention. Only components of the apparatus essential for the invention are shown. A signal 200 to be transmitted is applied to means 202 performing an outer coding. Reed-Solomon type coding can be preferably used as the outer coding, since it is well suited to correcting bursty errors. The coded signal is applied to first interleaving means 204 wherein a first interleaving is performed to the signal, the interleaving length of said first interleaving being chosen on the basis of the maximum delay defined for the system. The signal interleaved in such a manner is further applied to means 206 which perform an inner coding, and in which convolution coding can preferably be used. The coding method is not essential, however, as far as the present invention is concerned.

After the inner coding, the signal is applied to means 208 wherein a second interleaving is performed, whose interleaving length is substantially equal to the interleaving length of the first interleaving. The interleaving and coding means can preferably be implemented by signal or general processors or by separate components, as is understood by those skilled in the art. After the second interleaving the signal is applied to a modulator 210 wherein the signal is modulated in accordance with the prior art, and where a spread spectrum system is concerned, the signal is multiplied before the modulation by a spreading code characteristic of the connection. The modulated signal is applied to an antenna 214 through radio frequency parts 212.

Figure 3:
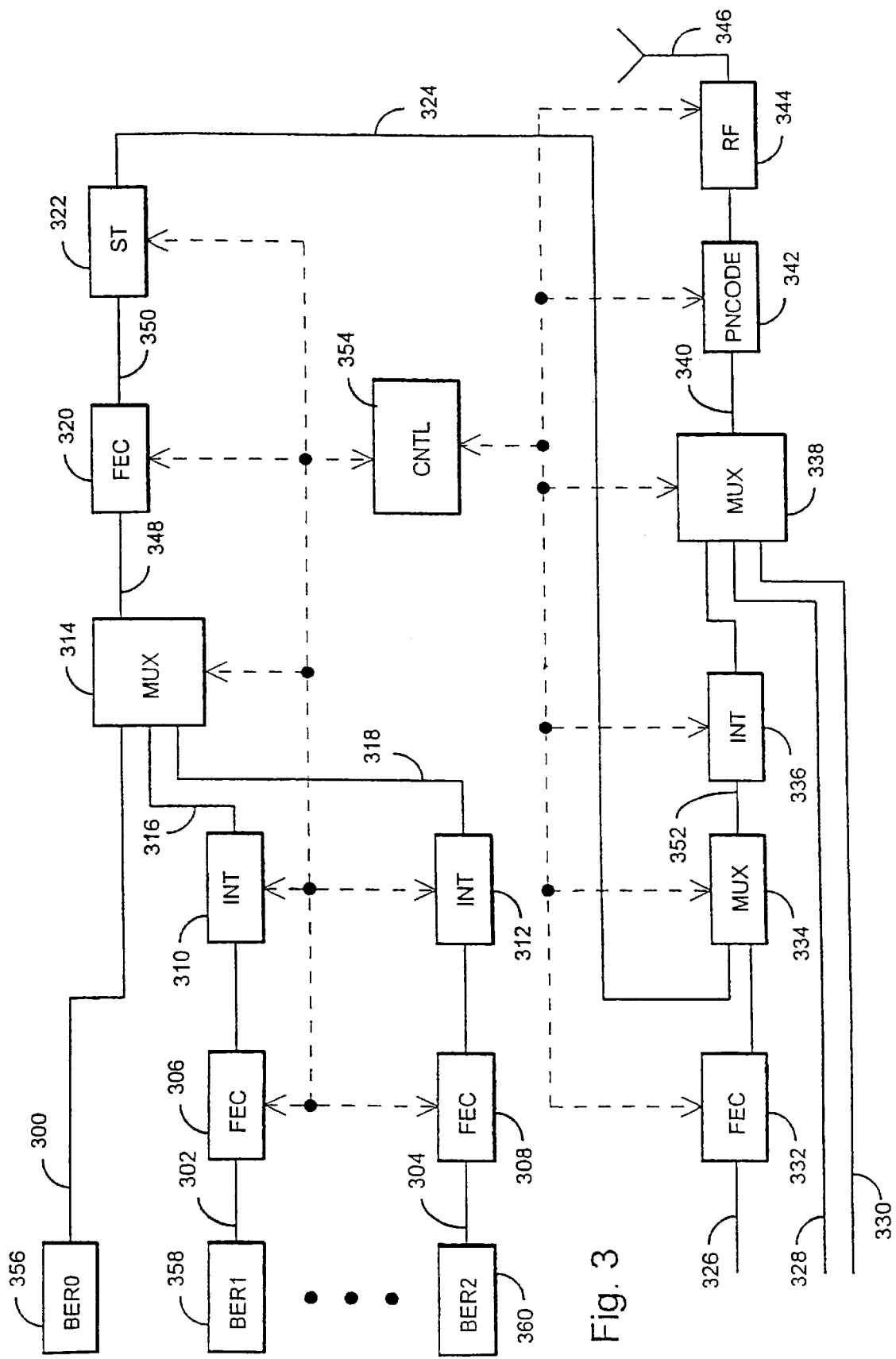
FIG. 3 illustrates another possible structure of the transmitter of the invention by means of a block diagram.

Let us next take a closer look at the preferred structure of the transmitter of the data transmission system of the invention by means of the block diagram of FIG. 3. The transmitter of the invention comprises a number of data transmitters 356 to 360 whose output signals 300 to 304 can have different quality standard requirements and data rates, and said data sources can generate signals to be transmitted simultaneously. Typical data transmitters that may come into question are, for example, a speech coder, telefax, videocoder or another source which generates digital data.

The transmitter of the invention further comprises first means 306, 308 for performing an outer coding to at least some signals to be transmitted in such a manner that on account of the coding, the quality standard requirement of the signals coded in this manner is as high as the lowest quality standard requirement of the active data sources. The same quality standard requirement is thus provided for all signals to be transmitted. The coding used can be performed in known manners, and the Reed-Solomon coding system can preferably be used. The transmitter further comprises first means 310, 312 for interleaving the coded signals, in other words for modifying the locations of the signal symbols in accordance with a known algorithm, using the interleaving length chosen on the basis of the maximum delay defined for the system.

Signals 300, 316, 318 obtained from all data sources and having a common quality standard requirement are applied to a multiplexer 314 wherein the signals are combined in time domain into frames of equal length, the number of bits in said frames being variable frame by frame, depending on the signals arriving at the input of the multiplexer. The output of the multiplexer is operatively connected to second coding means 320 wherein an inner coding is performed to a signal 348. This coder 320 may be any desired coder; in the preferred embodiment is used a convolution coder by which the common quality standard requirements can be lowered.

The signal 350 coded in this manner is further applied to means 322 wherein the number of symbols in each frame to be transmitted is equalized in such a manner that the length of the symbols to be transmitted in each frame is equal to the multiple of the known time period which is substantially shorter that the symbol length. When the CDMA method is used, the multiple of the length of a spreading code bit, in other words chip, may be in question.

The equalization of the number of the symbols can be performed either by repeating or removing symbols, both of which methods can be implemented by means of signal processing, as is well understood by those skilled in the art.

The transmitter of the system of the invention further comprises means 334 for combining data 326 on the frame structure of each frame, such as bit rate, to the symbol-equalized signal frames 324 to be transmitted. Said data 326 on the frame structure is first applied to coding means 332 wherein the desired coding to ensure the protection of the data against transmission errors is performed, and said coded signal is applied to a multiplexer 338. Said data may comprise, for example, said frame or a description of the frame structure of the frame to be transmitted next. The signal 352 combined in this manner is further applied to second interleaving means 336. In the interleaving means the interleaving is performed using substantially equal interleaving length as in connection with the first interleaving.

The transmitter may comprise the multiplexer 338 wherein additional data, such as power regulation data 330 or reference symbols 328, is combined to the interleaved signal for coherent reception. When a CDMA transmitter is involved, the combined signal 340 is further applied to a means 342 wherein the signal is multiplied by a spreading code characteristic of the connection, whereby the signal spreads to the frequency band used. The signal multiplied in this manner is further applied to radio frequency parts wherein the signal is converted to the radio frequency and amplified to be transmitted by an antenna 346.

The transmitter of the system of the invention further comprises control means 354 controlling the operation of the above parts, and said means can be implemented by means of a microprocessor or control logic, for example.

Let us also take a closer look at the reduction of the total system delay by means of the method of the invention. Since the interleaving length $t_i$ of the interleaving subsequent to the inner coding can be increased to equal the interleaving length $t_o$ of the interleaving subsequent to the outer coding, this interleaving length $t_o$ can be shortened without impairing the performance, compared with the solutions of the prior art. Using the above numerical values as an example, let us assume that previously $t_o$=100 ms and $t_i$=10 ms, thus the total delay caused by interleaving being 200 ms. In the solution of the invention, $t_o$ and $t_i$ can be chosen to be equal in length in such a manner, for instance, that both are given the value $t_o$=$t_i$=80 ms. The total delay caused by interleaving thus becomes 160 ms. The numerical values mentioned herein are only used by way of example. In practical solutions the values are chosen on the basis of system parameters.

Even though the invention has been described in the above with reference to the example in accordance with the accompanying drawings, it is to be understood that the invention is not restricted to it, but can be modified in many ways within the scope of the inventive idea disclosed in the appended claims.

What is claimed is:

1. A data transmission method in a wireless telecommunications system, the method comprising the steps of:

transmitting user signals in a given channel within a maximum delay defined for the system;

sequentially performing an outer coding and an inner coding on the signals to be transmitted;

performing a first interleaving to a signal after the outer coding;

choosing the interleaving length of the first interleaving to be within the scope of the maximum delay defined for the system; and performing a second interleaving to the signal after the inner coding wherein the interleaving length of the second interleaving is substantially equal to the interleaving length of the first interleaving and the signals to be transmitted comprise signals of several quality standards and data rates.

2. A data transmission method in a wireless telecommunications system, the method comprising steps of:

transmitting user signals in a given channel within a maximum delay defined for the system;

sequentially performing an outer coding and an inner coding on the signals to be transmitted;

performing a first interleaving to a signal after the outer coding;

choosing the interleaving length of the first interleaving to be within the scope of the maximum delay defined for the system;

performing a second interleaving to the signal after the inner coding wherein the interleaving length of the second interleaving is substantially equal to the interleaving length of the first interleaving and the signals to be transmitted include signals of several quality standards and data rates;

performing the outer coding in such a manner that all signals to be transmitted have a common quality standard;

combining the signals obtained in this manner having the same quality standard into frames of a given length;

performing the inner coding to the combined signal; and repeating or removing some symbols, if necessary, in the frames to be transmitted, in such a manner that the length of the symbols in each frame is the multiple of a time period that is substantially shorter than the symbol length.

3. A data transmission system wherein the user signals are transmitted wirelessly in a given channel and a maximum delay has been defined for the system, the system comprising:

means in the transmitting end for performing sequentially an outer coding and an inner coding to the signals to be transmitted;

wherein the system further comprises means for performing the outer coding in such a manner that all signals to be transmitted have a common quality standard;

means for combining the signals to be transmitted into frames that have a given length;

means for performing the inner coding to the signals to be transmitted; and means for repeating or removing some symbols in each frame, if necessary, in such a manner that the length of the symbols in each frame is equal to the multiple of a time period which is substantially shorter than the symbol length; and means for performing a first interleaving to a signal after the outer coding, the interleaving length of the first interleaving being chosen within the scope of the maximum delay defined for the system, wherein the system further comprises means for performing a second interleaving to the signal after the inner coding, the interleaving length of the second interleaving being substantially equal to the interleaving length of the first interleaving.

* * * * *

UNITED STATES PATENT AND TRADEMARK OFFICE
CERTIFICATE OF CORRECTION

PATENT NO. : 6,460,156 B1
DATED : October 1, 2002
INVENTOR(S) : Laukkanen et al.

It is certified that error appears in the above-identified patent and that said Letters Patent is hereby corrected as shown below:

<u>Title page,</u>
Item [86], "[86] PCT No.: PCT/FI99/00596" should read
-- [86] PCT No.: PCT/FI98/00596 --.

Signed and Sealed this

Sixteenth Day of September, 2003

JAMES E. ROGAN
*Director of the United States Patent and Trademark Office*